US006766285B1

(12) United States Patent
Allen, Jr. et al.

(10) Patent No.: US 6,766,285 B1
(45) Date of Patent: Jul. 20, 2004

(54) PREDICTIVE PROCESSING METHOD IN A SEMICONDUCTOR PROCESSING FACILITY

(75) Inventors: Sam H. Allen, Jr., New Braunfels, TX (US); Michael R. Conboy, Austin, TX (US); Jason Grover, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/570,305

(22) Filed: May 12, 2000

(51) Int. Cl.[7] ............................................... G06F 9/45
(52) U.S. Cl. ...................... 703/22; 703/1; 703/2; 703/6; 716/4; 700/108; 700/121
(58) Field of Search .......................... 703/1–2, 6, 22; 716/1–4; 700/121, 108

(56) References Cited

U.S. PATENT DOCUMENTS 6,148,239 A  * 11/2000  Funk et al. .................... 700/1
6,336,086 B1 *  1/2002  Perez et al. .................. 703/13
6,556,959 B1 *  4/2003  Miller et al. .................. 703/2

OTHER PUBLICATIONS

Chen et al, "Real–Time Dispatching Reduces Cycle Time", Semiconductor International, vol. 23, No. 3, pp. 109–112 (Mar. 2000).*
Norman et al, "Process and Material Handling Models Integration", IEEE Simulation Conference Proceedings, vol. 2, pp. 1262–1267 (Dec. 1999).*
Hsieh et al, "Fast Fab Scheduling Rule Selection by Ordinal Comparison–Based Simulation", 1999 IEEE International Symposium on Semiconductor Manufacturing, pp. 53–56 (Oct. 1999).*
Johal, "Simulation Reduces Product Cycle Time", Semiconductor International, vol. 21 No. 4, pp. 101–102 (Apr. 1998).*
Kim et al, "Due–Date Based Scheduling and Control Policies in a Multiproduct Semiconductor Wafer Fabrication Facility", IEEE Transactions on Semiconductor Manufacturing, vol. 11 No. 1, pp. 155–164 (Feb. 1998).*
Thompson, "Simulation–Based Scheduling: Meeting the Semiconductor Fabrication Challenge", IEE Solutions, vol. 28 No. 5, pp. 30–34 (May 1996).*

* cited by examiner

Primary Examiner—Samuel Broda

(57) ABSTRACT

Wafer processing cycle times are substantially reduced by predicting and correcting downstream processing location anomalies before a wafer lot is released to the next processing location on the processing line. In an example embodiment, a method of verifying downstream processing line readiness in a semiconductor processing facility having a material handling system includes presenting a wafer lot to a first application processing location. A signal is then sent to a second application processing location to verify readiness by simulating the second application processing on the wafer lot. The availability or operating status of the second processing location is then communicated to the material handling system, the material handling system communicating instructions to the first processing location on where to send the wafer lot after the processing simulation is complete. The readiness verification method is repeated until the wafer lot is completely processed.

20 Claims, 2 Drawing Sheets

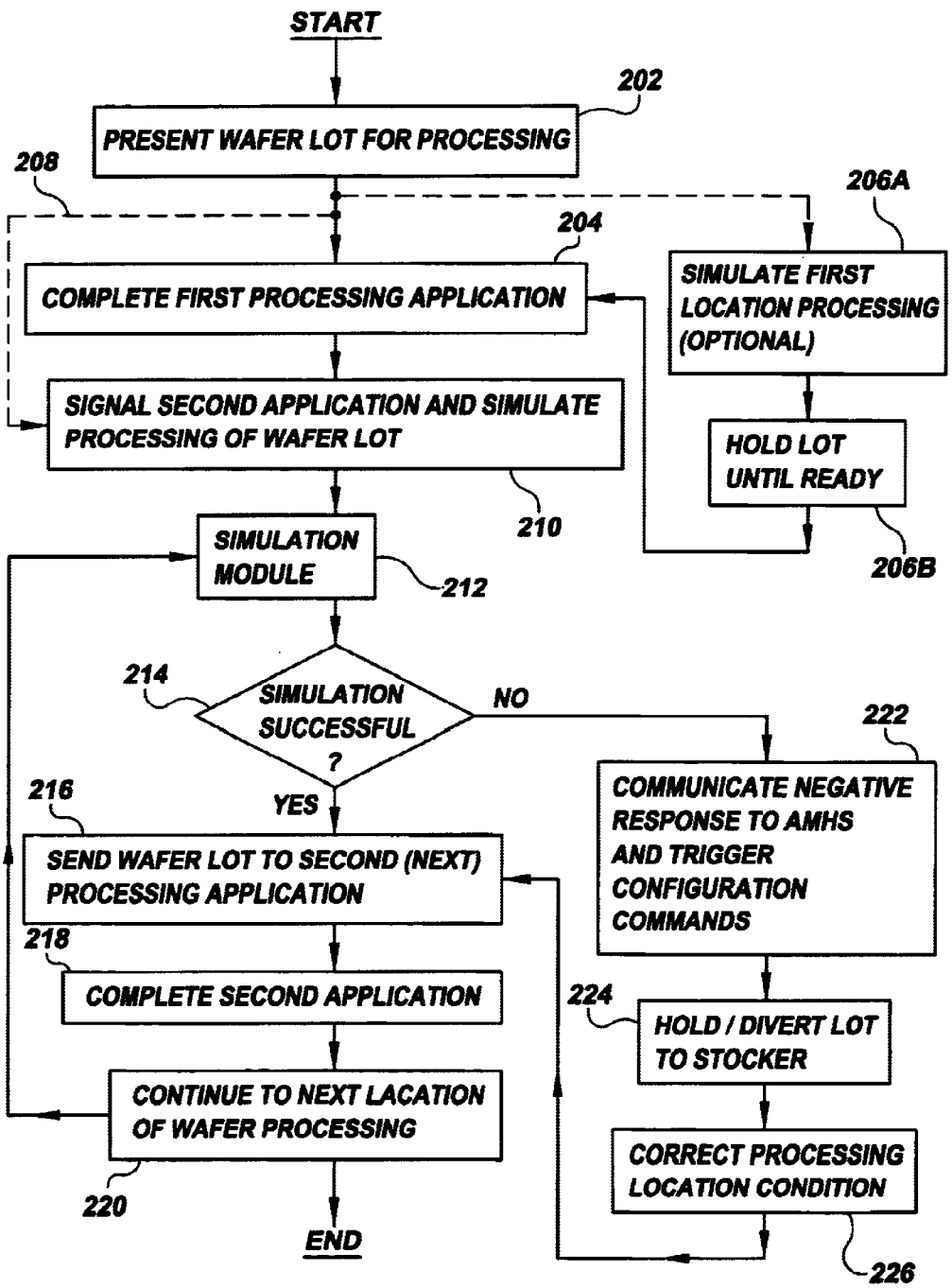

PREDICTIVE PROCESSING METHOD IN A SEMICONDUCTOR PROCESSING FACILITY

FIELD OF THE INVENTION

The present invention generally relates to wafer processing systems within a semiconductor processing facility and, more particularly, to decreasing wafer processing cycle time by predicting and correcting processing delays that can occur downstream from the current wafer processing location.

BACKGROUND OF THE INVENTION

A conventional semiconductor processing plant typically includes multiple processing areas or bays interconnected by a path, such as a conveyor belt. Each bay generally includes the requisite processing tools to process semiconductor wafers for a particular purpose, such as photolithography, chemical-mechanical polishing or chemical vapor deposition, for example. Material stockers or stocking tools generally lie about the plant and store semiconductor wafers waiting to be processed. Each material stocker typically services two or more bays and can hold hundreds of cassettes. The wafers are usually stored in cassettes and then disposed within a carrier that moves the wafers from processing location to another. The carriers are usually tracked by their carrier code by a computer system as they move through the plant.

Once a wafer lot has been retrieved, and the equipment has been set up, the processing on the wafers by a particular piece of equipment, or "tool," can begin. At this point, the wafer lot is "moved-in" to the processing location. An operator on the line then communicates this information to the host computer. The wafer lot remains in this state until processing is completed. The operator then must perform tests and verifications on the integrity of the wafers. When all tests and verifications have been performed, the host computer application program must be notified. Wafers may have moved from one cassette to another as a result of wafer processing; therefore the host application and computer have to be notified of these moves. The operator then places the cassette of "moved-out" wafers in the material stocker to await orders as to where the wafers will be sent next.

The semiconductor processing plant, including the bays, material stockers and an automated material handling system, generally operates under control of a distributed computer system running a factory management program. In this environment, the automated material handling system (AMHS) conceptually includes the cassettes, pods and the transportation system. An empty carriers management system and a separate test wafer management system are usually included and integrated into the AMHS. One of the goals in moving wafer lots from one processing location to another in a processing plant is to do so in a manner that will reduce overall processing cycle time. Unfortunately, situations such as improper factory management software and tooling setups, the use of incorrect software in tooling or the use of outdated software versions in tooling at a certain processing location tend to increase cycle times for wafer processing while the situation is corrected.

SUMMARY OF THE INVENTION

The present invention is directed to addressing the above and other needs in connection with decreasing cycle time in wafer processing by predicting and correcting downstream processing delays before a wafer lot is released to the next processing location. The invention also addresses issues that include improper setups with respect to equipment interfaces, network systems, other factory systems, improper software versions and incorrect recipes.

According to one aspect of the invention, it has been discovered that wafer processing cycle times are reduced when downstream processing locations are polled, prior to arrival of a wafer lot, to determine if the downstream processing location is prepared to receive the upcoming wafer lot. Any incompatibilities or anomalies are addressed immediately to ensure that wafer lots are moving through the processing line without delays or diversions of material.

According to another aspect of the invention, a method for forecasting processing delays in a semiconductor processing facility having a material handling system includes presenting a wafer lot to a first application processing location. The first processing application is then applied to the wafer lot and a set of first application processing results for the wafer lot is then generated and communicated to a second application processing location. The second application processing on the wafer lot is then simulated based on the first application results in order to determine availability status of the second processing location to receive the wafer lot. The availability or operating status of the second processing location is then communicated to the material handling system, the material handling system communicating instructions to the first processing location on where to send the wafer lot after the simulation is complete.

In yet another aspect of the invention, a method of verifying downstream processing line readiness in a semiconductor processing facility having a material handling system includes presenting a wafer lot to a first application processing location. A signal is then sent to a second application processing location to verify readiness by simulating the second application processing on the wafer lot. The operating status of the second processing location is then communicated to the material handling system, the material handling system communicating instructions to the first processing location on where to send the wafer lot after the simulation is complete.

In yet another aspect of the invention, a system for forecasting processing delays in a semiconductor processing facility includes a material handling system for presenting a wafer lot to a first application processing location. A processing tool applies the first application to the wafer lot and measurements are taken to generate set of first application processing results for the wafer lot. A communications module communicates the first application results as data to a second application processing location. A simulation module simulates the second application processing on the wafer lot based on the first application results in order to determine the availability status of the second processing location to receive the wafer lot.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 2 is a flowchart illustrating a method of forecasting downstream processing delays in accordance with one embodiment of the invention.

Figure 1:
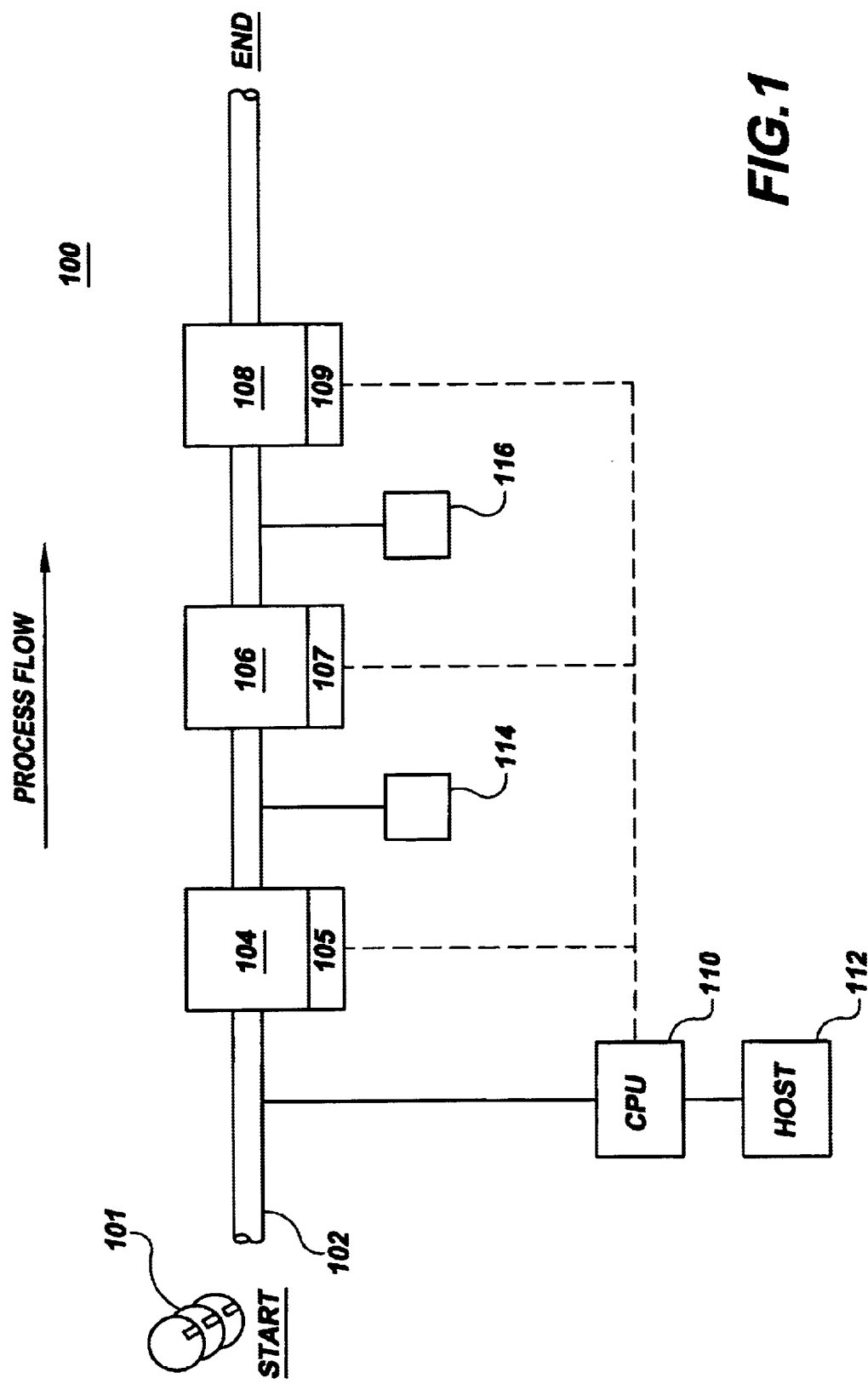
FIG. 1 is a process flow diagram illustrating the wafer and data flow in a downstream readiness verification processing system in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a method and system for forecasting downstream wafer processing delays within a semiconductor processing facility. The invention is particularly suited for reducing wafer processing cycle times by identifying and correcting downstream processing location anomalies before a wafer lot is released for processing or released to proceed to the next processing location on the line. While the present invention is not necessarily limited to a wafer processing application the invention will be better appreciated using a discussion of exemplary embodiments in such a specific context.

In an example embodiment, a method of forecasting processing delays in a semiconductor processing facility includes a material handling system that presents a wafer lot to a first application processing location. The first processing application is applied to the wafer lot and a set of processing results is generated for the wafer lot. The first application results are then communicated via the material handling system to a second application processing location. At the second application processing location the wafer processing application is simulated, via a simulation module, on the upcoming wafer lot based on the first application results. The processing simulation is performed in order to determine the availability (or operating status) of the second processing location to receive the upcoming wafer lot. The second processing location then communicates its availability or status to the material handling system, the material handling system communicating instructions to the first processing location on where to send the wafer lot after the simulation is complete.

Referring now to the figures, FIG. 1 illustrates a process flow diagram of the operation of downstream readiness verification system 100. In this example, system 100 includes a material handling system 102, which in its simplest form includes a conveyor belt, that moves a set of wafers 101 to several processing locations. System 100 also includes processing locations 104, 106 and 108 having communications/simulation modules 105, 107 and 109, respectively. Wafers 101 are released and are moved by material handling system 102 to first processing location 104. A computer arrangement is coupled to material handling system 102 at various points to monitor the location and status of the wafer lot being processed. A host system 112 that manages the overall processing system of the semiconductor plant is coupled to computer arrangement 110 to receive information on the operating status of system 100 and its components. The tooling equipment at blocks 104–108, in one example, are coupled via cable through material handling system 102 to computer 108, or through a wireless link, to provide readiness status of the tooling equipment as the wafers are about to be processed. A set of wafer stockers 114 and 116 is included in system 100 for holding wafers that have been diverted off the line while one of the processing locations is being setup for processing.

In this example, upon completion of the wafer processing of wafer lot 101 at processing location 104, system 100 "looks ahead" to the next processing location (location 106) and simulates all of the actions that would occur at that processing location. By running the simulation at simulation modules 107, computer 110 will then be advised in advance whether processing location 106 has the correct setup and is ready to successfully receive upcoming wafer lot 101. Such downstream readiness verification will prevent unnecessary accrued cycle time when specifications, general MES and recipe setups have not been properly completed. The items that are checked and simulated are configurable depending on the wafer processing recipe and other directives that are made concerning the wafer lot. Where system 100 polls the next processing location and detects that a tooling setup is not ready or that the incorrect software is loaded on the tool, the system (via computer 110) will invoke a predetermined set of commands for the processing system upstream to execute. The commands are a configurable set of actions that include sending a page or e-mail to the appropriate operator to correct the tooling situation. In another example, the set of actions include sending a signal via the material handling system to an upstream material handler to divert the upcoming set of wafers to a stocker for temporary storage until the tooling equipment downstream is properly configured, setup or repaired.

The simulation module for the processing location accounts for any special processing needs introduced by the processing recipe by simulating the implementation of the recipe on the upcoming wafer lot. The simulation module is programmed to conduct verification of the compatibility of tooling and software in relation to the processing recipe. The simulation module is also programmed to analyze wafer processing results received from a first processing location and determine whether the processing parameters of the second processing location have to be adjusted to compensate for any processing shortcomings of the first location. Once the necessary adjustments to the second location are identified the adjustments are made and wafer processing continues. Finally, the simulation module also assesses the availability of materials, such as reticles, control threads, automated equipment or the like, in verifying readiness of the next processing location. System 100 provides an advantage of preventing incorrect processing where the downstream tooling is also not configured properly due to a last minute change in the recipe or the discovery of a quality issue.

Referring now to FIG. 2, a flowchart 200 exemplifies the manner in which system 100 proceeds to conduct a downstream readiness verification or forecasts a processing delay according to one embodiment of the invention. At block 202, a wafer lot is presented for processing and at block 204 the wafer lot is put through the first processing application. In an alternative embodiment, after block 202 the flow proceeds to block 206A where the first application processing location is signaled to simulate processing to verify readiness or operating status. At block 206B, the wafer lot is put on hold until the first processing location is correctly setup and then the system returns to the normal flow at block 204.

In another embodiment, after block 202 and before the wafer lot is submitted to the first processing location, path 208 is followed to block 210 where a signal is sent out to the second processing location to simulate processing to verify readiness. The signal that returns then determines whether the wafer lot is to be diverted rather than inserted into the first processing application at the current time due to a substantial delay at the second location. At block 204, the first processing location communications module sends a signal to the second processing location to simulate processing, through the simulation module at block 212, with or without the results of the processing of the first application to verify readiness. Where the first application processing results are sent, the simulation module at the second location determines whether a processing change is to be made at the second location processing parameters to compensate for possible shortcomings generated by the first location (e.g. a layer not deposited to the correct thickness, or wafers need to be rotated due to a processing imbalance at the first location, etc.). This approach provides a wafer processing system that is more dynamic in correcting processing issues real time.

At block 214, a determination is made whether the simulation was successful in that the second (next) processing location is ready to receive the wafer lot from the first (prior) location. At block 216, the simulation is successful and the wafer lot is sent to the second (next) processing location. At block 218, the second location processing is completed and at block 220 a signal is sent ahead to the next processing location through block 212 for verification of readiness, thereby repeating the cycle at every processing location until wafer processing is completed. Where certain locations are not ready to proceed, the wafer is diverted to a stocker for temporary storage, as illustrated in FIG. 1, to wait while the tooling or equipment setup is corrected.

Where a determination is made at block 214 that the simulation was not successful and the next location is not ready, a negative response is communicated at block 222 to the material handling system. The negative response triggers a command that includes the configurable set of actions for correcting the problem identified by the simulation module at that location. While the issue is being addressed with respect to the processing location, at block 224 the wafer lot is diverted to a wafer stocker for temporary storage. At block 226, the negative response condition is corrected and then the wafer lot proceeds to the next processing location. After block 226, the flow moves back to block 216 where the wafer lot proceeds through the line until wafer processing is complete.

In a related application, the invention is adapted to verify that other processing areas and systems are properly set up before a wafer lot is released or set that a certain part of the plant. This includes but is not limited to improper software and/or versions that are loaded into the factory management system, tooling, equipment interfaces, network systems and the like. Also recipes that are incorrect for the wafer lot to be processed are detectable and are alterable before the wafer lot arrives to a certain processing tool.

As noted above, the present invention is applicable to forecasting processing delays or for verifying downstream processing readiness in a semiconductor processing facility. Accordingly, the present invention is not be necessarily limited to the particular examples described above, but is intended to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of forecasting processing delays in a semiconductor processing facility having a material handling system, the method comprising:

presenting a wafer lot to a first application processing location and applying the first application to the wafer lot;

generating a set of first application processing results for the wafer lot and communicating the first application results to a second application processing location;

simulating the second application processing on the wafer lot based on the first application results in order to determine operating status of the second processing location to receive the wafer lot; and communicating operating status of the second processing location to the material handling system, the material handling system communicating instructions to the first processing location on where to send the wafer lot after the simulation is complete.

2. The method of claim 1, wherein the step of simulating the second application includes providing a simulation module that simulates all actions that would occur at the second processing location to ensure that the correct setup is in place.

3. The method of claim 2, wherein the step of communicating the operating status includes the material handling system instructing the first processing location to hold or divert the wafer lot to a stocking location.

4. The method of claim 2, wherein the simulation module simulates the processing of the wafer lot with a wafer processing recipe.

5. The method of claim 4, further including the step of verifying compatibility of software to the processing recipe.

6. The method of claim 5, further including the step of verifying compatibility of the tooling to the processing recipe.

7. The method of claim 1, wherein the step of simulating the second application processing further includes the steps of:

identifying wafer processing shortcomings from the first application results; and adjusting the second application processing to overcome the identified shortcomings.

8. The method of claim 7, using a computer arrangement to operate the simulation module and to store processing results.

9. The method of claim 8, further including the step of coupling the computer arrangement with the material handling system.

10. A method of verifying downstream processing line readiness in a semiconductor processing facility having a material handling system, the method comprising:

presenting a wafer lot to a first application processing location;

simulating the second application processing on the wafer lot; and communicating operating status of the second processing location to the material handling system, the material handling system communicating instructions to the first processing location on where to send the wafer lot after the simulation is complete.

11. The method of claim 10, after the step of sending a signal to the second processing location, further include the steps of:

applying the first application to the wafer lot;

generating a set of first application processing results for the wafer lot and communicating the first application results to a second application processing location; and simulating the second application processing on the wafer lot based on the first application results in order to determine operating status of the second processing location to receive the wafer lot.

12. The method of claim 11, wherein the step of communicating the operating status includes the material handling system instructing the first processing location to hold or divert the wafer lot to a stocking location.

13. The method of claim 10, wherein the step of simulating the second application includes providing a simulation module that simulates all actions that would occur at the second processing location to ensure that the correct setup is in place.

14. The method of claim 13, wherein the step of simulating the second application processing further includes the steps of:

identifying wafer processing shortcomings from the first application results; and adjusting the second application processing to overcome the identified shortcomings.

15. A system for forecasting processing delays in a semiconductor processing facility, the system comprising:

means for presenting a wafer lot to a first application processing location;

means for applying a wafer processing recipe to the wafer lot;

means for generating a set of first application processing results for the wafer lot;

means for communicating the first application results to a second application processing location; and means for simulating the second application processing on the wafer lot based on the first application results in order to determine operating status of the second processing location to receive the wafer lot.

16. The system of claim 15, further including means for communicating operating status of the second processing location to a material handling system, the material handling system communicating instructions to the first processing location on where to send the wafer lot after the simulation is complete.

17. The system of claim 15, wherein means for simulating the second application includes a simulation module that simulates all actions that would occur at the second processing location to ensure that the correct setup is in place.

18. The system of claim 17, wherein the simulation module simulates the processing with the wafer processing recipe and verifies the compatibility of the tooling and the software with the recipe.

19. A system for verifying downstream processing line readiness in a semiconductor processing facility, the system comprising:

means for presenting a wafer lot to a first application processing location;

means for simulating the second application processing on the wafer lot; and means for communicating operating status of the second processing location to a material handling system, the material handling system communicating instructions to the first processing location on where to send the wafer lot after the simulation is complete.

20. The system of claim 19, wherein the system further includes:

means for applying a wafer processing recipe to the wafer lot;

means for generating a set of first application processing results for the wafer lot and communicating the first application results to a second application processing location; and means for simulating the second application processing on the wafer lot based on the first application results in order to determine operating status of the second processing location to receive the wafer lot.

* * * * *